US009450060B2

(12) United States Patent
Hiyoshi et al.

(10) Patent No.: US 9,450,060 B2
(45) Date of Patent: Sep. 20, 2016

(54) METHOD OF MANUFACTURING A SILICON CARBIDE SEMICONDUCTOR DEVICE

(71) Applicant: Sumitomo Electric Industries, Ltd., Osaka-shi (JP)

(72) Inventors: Toru Hiyoshi, Osaka (JP); Yu Saitoh, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/439,144

(22) PCT Filed: Oct. 8, 2013

(86) PCT No.: PCT/JP2013/077325
§ 371 (c)(1),
(2) Date: Apr. 28, 2015

(87) PCT Pub. No.: WO2014/083942
PCT Pub. Date: Jun. 5, 2014

(65) Prior Publication Data
US 2015/0263115 A1    Sep. 17, 2015

(30) Foreign Application Priority Data
Nov. 28, 2012  (JP) .................................. 2012-259550

(51) Int. Cl.
*H01L 31/0312*    (2006.01)
*H01L 29/423*    (2006.01)
(Continued)

(52) U.S. Cl.
CPC ....... *H01L 29/42368* (2013.01); *H01L 21/045* (2013.01); *H01L 21/049* (2013.01);
(Continued)

(58) Field of Classification Search
CPC ............. H01L 31/0312; H01L 29/456; H01L 29/7803; H01L 29/66068; H01L 29/7811
USPC .......................................................... 257/77
See application file for complete search history.

(56) References Cited

U.S. PATENT DOCUMENTS 4,217,149 A * 8/1980 Sawazaki ........ H01L 21/823807
257/376
4,757,028 A    7/1988 Kondoh et al.
(Continued)

FOREIGN PATENT DOCUMENTS

JP    62-081764 A    4/1987
JP    01-289165 A    11/1989
(Continued)

OTHER PUBLICATIONS

Notice of Grounds of Rejection in Japanese Patent Application No. 2012-259550, dated Oct. 13, 2015.
(Continued)

*Primary Examiner* — Phuc Dang
(74) *Attorney, Agent, or Firm* — Venable LLP; Michael A. Sartori

(57) ABSTRACT

A silicon carbide substrate includes a first impurity region, a well region in contact with the first impurity region, and a second impurity region separated from the first impurity region by the well region. A first main surface includes a first region in contact with a channel region, and a second region different from the first region. A silicon-containing material is formed on the second region. A first silicon dioxide region is formed on the first region. A second silicon dioxide region is formed by oxidizing the silicon-containing material. A gate runner is electrically connected to a gate electrode and formed in a position facing the second silicon dioxide region. Consequently, a silicon carbide semiconductor device capable of achieving improved insulation performance between the gate runner and the substrate while the surface roughness of the substrate is suppressed, and a method of manufacturing the same can be provided.

11 Claims, 17 Drawing Sheets

(51) Int. Cl.
  *H01L 29/40* (2006.01)
  *H01L 29/66* (2006.01)
  *H01L 29/739* (2006.01)
  *H01L 29/16* (2006.01)
  *H01L 29/78* (2006.01)
  *H01L 21/04* (2006.01)
  *H01L 29/51* (2006.01)
  H01L 29/06 (2006.01)
  H01L 29/04 (2006.01)

(52) U.S. Cl.
  CPC ....... *H01L29/0634* (2013.01); *H01L 29/1608* (2013.01); *H01L 29/402* (2013.01); *H01L 29/4238* (2013.01); *H01L 29/512* (2013.01); *H01L 29/66068* (2013.01); *H01L 29/7395* (2013.01); *H01L 29/7811* (2013.01); *H01L 29/045* (2013.01); *H01L 29/0615* (2013.01); *H01L 29/0619* (2013.01); *H01L 29/42372* (2013.01)

(56) References Cited

U.S. PATENT DOCUMENTS

| | | |
|---|---|---|
| 6,048,759 A | 4/2000 | Hshieh et al. |
| 2002/0052102 A1 | 5/2002 | Kiritani |
| 2010/0155879 A1* | 6/2010 | Schulze ............. H01L 27/0207 257/503 |
| 2011/0284874 A1 | 11/2011 | Miura et al. |
| 2012/0049202 A1 | 3/2012 | Nakano |
| 2012/0205669 A1* | 8/2012 | Miura ................ H01L 29/1095 257/77 |
| 2013/0020587 A1 | 1/2013 | Hino et al. |
| 2013/0026494 A1* | 1/2013 | Oritsuki ............... H01L 29/456 257/77 |

FOREIGN PATENT DOCUMENTS

| | | |
|---|---|---|
| JP | 11-266014 A | 9/1999 |
| JP | 2000-277514 A | 10/2000 |
| JP | 2003-318392 A | 11/2003 |
| JP | 2011-129547 A | 6/2011 |
| WO | WO-2010/098294 A1 | 9/2010 |
| WO | WO-2010/119789 A1 | 10/2010 |
| WO | WO-2010/125661 A1 | 11/2010 |
| WO | WO-2011/125274 A1 | 10/2011 |
| WO | WO-2012/001837 A1 | 1/2012 |

OTHER PUBLICATIONS

International Search Report issued in PCT International Application No. PCT/JP2013/077325 dated Dec. 10, 2013.

Extended European Search Report in European Application No. 13859222, dated Jul. 7, 2016.

* cited by examiner

METHOD OF MANUFACTURING A SILICON CARBIDE SEMICONDUCTOR DEVICE

TECHNICAL FIELD

The present invention relates to silicon carbide semiconductor devices and methods of manufacturing the same, and more particularly to a silicon carbide semiconductor device capable of achieving improved breakdown voltage characteristics of a gate runner and a method of manufacturing the same.

BACKGROUND ART

In recent years, silicon carbide has been increasingly employed as a material for a semiconductor device such as a MOSFET (Metal Oxide Semiconductor Field Effect Transistor) in order to allow a higher breakdown voltage, lower loss and the use in a high-temperature environment and the like of the semiconductor device. Silicon carbide is a wide band gap semiconductor having a band gap wider than that of silicon which has been conventionally and widely used as a material for a semiconductor device. By employing the silicon carbide as a material for a semiconductor device, therefore, a higher breakdown voltage, lower on-resistance and the like of the semiconductor device can be achieved. A semiconductor device made of silicon carbide also has the advantage of exhibiting less performance degradation when used in a high-temperature environment than a semiconductor device made of silicon.

In a MOSFET, a gate runner made of a material having lower electrical resistivity than that of a gate electrode may be formed on the outer periphery for efficient transmission of a gate signal to the gate electrode. According to a MOSFET described in Japanese Patent Laying-Open No. 11-266014 (PTD 1), for example, a gate electrode (gate runner) is arranged in an outer peripheral region on a silicon carbide substrate. According to a MOSFET described in WO 2010/098294 (PTD 2), a gate electrode is arranged above a p type semiconductor layer, and a pad portion for the gate electrode (gate runner) is arranged in contact with the gate electrode.

According to the MOSFETs described in the aforementioned documents, an oxide film is formed between the pad portion for the gate electrode (gate runner) and the silicon carbide substrate in order to ensure insulation performance between the pad portion for the gate electrode and the silicon carbide substrate.

CITATION LIST

Patent Documents

PTD 1: Japanese Patent Laying-Open No. 11-266014
PTD 2: WO 2010/098294

SUMMARY OF INVENTION

Technical Problem

The above-described oxide film is formed by plasma CVD, for example. When the silicon carbide substrate is placed within plasma, however, surface roughness of the silicon carbide substrate may occur. Alternatively, a thermal oxidation film may be formed by thermally oxidizing the surface of the silicon carbide substrate. A high thermal oxidation temperature is required in order to form a thermal oxidation film having a thickness that can ensure an insulator breakdown voltage. However, a high thermal oxidation temperature may cause the occurrence of surface roughness of the silicon carbide substrate.

The present invention has been made to solve such a problem, and an object of the present invention is to provide a silicon carbide semiconductor device capable of achieving improved insulation performance between a gate runner and a silicon carbide substrate while suppressing surface roughness of the silicon carbide substrate, and a method of manufacturing the same.

Solution to Problem

The present inventors conducted a detailed study and arrived at the present invention based on the following findings. By forming a silicon-containing material in a position facing a region where a gate runner is to be formed, and oxidizing the silicon-containing material, a thick silicon dioxide film can be readily formed. Since the silicon dioxide film formed by the oxidation of the silicon-containing material has a lower carbon concentration than in a silicon dioxide film formed by oxidation of silicon carbide and therefore has excellent insulation performance, the insulation performance between the gate runner and a substrate can be improved. Furthermore, plasma is not used, and an oxidation temperature does not need to be increased. Consequently, the insulation performance between the gate runner and the silicon carbide substrate can be improved while the surface roughness of the substrate is suppressed.

A silicon carbide semiconductor device of the present invention includes the following steps. A silicon carbide substrate including a first main surface and a second main surface facing each other is prepared. The silicon carbide substrate includes a first impurity region having a first conductivity type, a well region being in contact with the first impurity region and having a second conductivity type different from the first conductivity type, and a second impurity region separated from the first impurity region by the well region and having the first conductivity type. The first main surface includes a first region in contact with a channel region sandwiched between the first impurity region and the second impurity region, and a second region different from the first region. A silicon-containing-material is formed on the second region. A first silicon dioxide region is formed on the first region. A second silicon dioxide region is formed by oxidizing the silicon-containing-material. A gate electrode is formed in contact with the first silicon dioxide region and the second silicon dioxide region. A gate runner electrically connected to the gate electrode and arranged in a position facing the second silicon dioxide region is formed. The thickness of the second silicon dioxide region is greater than the thickness of the first silicon dioxide region.

According to the method of manufacturing a silicon carbide semiconductor device of the present invention, after the silicon-containing material is formed on the second region, the second silicon dioxide region is formed by oxidizing this silicon-containing material. The gate runner is formed in a position facing the second silicon dioxide region. Consequently, the insulation performance between the silicon carbide substrate and the gate runner can be improved while the surface roughness of the silicon carbide substrate is suppressed.

Preferably, in the silicon carbide semiconductor device, the step of forming a first silicon dioxide region and the step of forming a second silicon dioxide region are performed by simultaneously oxidizing the first region and the silicon-containing-material. Consequently, the first silicon dioxide region and the second silicon dioxide region are efficiently formed.

Preferably, in the method of manufacturing a silicon carbide semiconductor device, the thickness of the second silicon dioxide region is 1.5 times or more and 5 times or less the thickness of the first silicon dioxide region. When the first thickness is 1.5 times or more the second thickness, a carbon concentration in the first silicon dioxide region can be efficiently made higher than a carbon concentration in the second silicon dioxide region. When the first thickness is 5 times or less the second thickness, on the other hand, a level difference between the gate electrode formed on the second silicon dioxide region and the gate electrode formed on the first silicon dioxide region does not become too great, thus allowing the gate electrode to be formed without being isolated.

Preferably, the method of manufacturing a silicon carbide semiconductor device further includes the step of forming a source wire arranged so as to be surrounded by the gate runner when viewed two-dimensionally. Consequently, a voltage can be efficiently applied to the gate electrode from the entire outer peripheral region of the chip.

Preferably, in the method of manufacturing a silicon carbide semiconductor device, the gate runner is formed on an outer side relative to the second impurity region. Consequently, the gate runner is formed on an outer side relative to the source wire.

Preferably, in the method of manufacturing a silicon carbide semiconductor device, the silicon carbide substrate further includes a JTE region in contact with the well region. The gate runner is formed on an inner side relative to the JTE region. Consequently, deterioration in breakdown voltage of the silicon carbide semiconductor device can be suppressed.

Preferably, in the method of manufacturing a silicon carbide semiconductor device, the second silicon dioxide region is formed so as to be in contact with an end portion of the first main surface. Consequently, the breakdown voltage between the gate runner and the silicon carbide substrate can be further improved.

Preferably, the method of manufacturing a silicon carbide semiconductor device further includes the step of forming a source wire arranged so as to sandwich the gate runner therebetween when viewed two-dimensionally. Consequently, a voltage can be applied to the gate electrode from an area near the center of the chip.

Preferably, in the method of manufacturing a silicon carbide semiconductor device, the step of forming a gate runner includes the step of forming a gate pad for applying a voltage to the gate runner. The gate runner is formed so as to extend from the gate pad in a branching manner. Consequently, the gate runner can be arranged close to the gate electrode to thereby efficiently apply a voltage to the gate electrode.

Preferably, the method of manufacturing a silicon carbide semiconductor device further includes the steps of forming a second silicon-containing-material in contact with the first impurity region, and forming a third silicon dioxide region by oxidizing the second silicon-containing-material. Consequently, a thick silicon dioxide region is formed on the first impurity region. As a result, the capacitance in the vicinity of a gate insulating film is reduced, thereby improving the switching characteristics of the silicon carbide semiconductor device.

Preferably, in the method of manufacturing a silicon carbide semiconductor device, the step of forming a second silicon dioxide region and the step of forming a third silicon dioxide region are simultaneously performed. Consequently, the second silicon dioxide region and the third silicon dioxide region are efficiently formed.

A silicon carbide semiconductor device according to the present invention includes a silicon carbide substrate, a first silicon dioxide region, a second silicon dioxide region, a gate electrode, and a gate runner. The silicon carbide substrate includes a first main surface and a second main surface facing each other. The silicon carbide substrate includes a first impurity region having a first conductivity type, a well region being in contact with the first impurity region and having a second conductivity type different from the first conductivity type, and a second impurity region separated from the first impurity region by the well region and having the first conductivity type. The first main surface includes a first region in contact with a channel region sandwiched between the first impurity region and the second impurity region, and a second region different from the first region. The first silicon dioxide region is arranged on the first region. The second silicon dioxide region is arranged on the second region. The gate electrode is in contact with the first silicon dioxide region and the second silicon dioxide region. The gate runner is electrically connected to the gate electrode and arranged in a position facing the second silicon dioxide region. The thickness of the second silicon dioxide region is greater than the thickness of the first silicon dioxide region. A carbon concentration in the second silicon dioxide region is lower than a carbon concentration in the first silicon dioxide region.

According to the silicon carbide semiconductor device of the present invention, the gate runner is arranged in a position facing the second silicon dioxide region, and the carbon concentration in the second silicon dioxide region is lower than the carbon concentration in the first silicon dioxide region. Consequently, the insulation performance between the gate runner and the silicon carbide substrate can be improved.

Preferably, in the silicon carbide semiconductor device, the thickness of the second silicon dioxide region is 1.5 times or more and 5 times or less the thickness of the first silicon dioxide region.

Advantageous Effects of Invention

As is evident from the description above, according to the present invention, a silicon carbide semiconductor device capable of achieving improved insulation performance between a gate runner and a silicon carbide substrate while suppressing surface roughness of the silicon carbide substrate, and a method of manufacturing the same can be provided.

DESCRIPTION OF EMBODIMENTS

Embodiments of the present invention will be described below with reference to the drawings. In the following drawings, the same or corresponding parts have the same reference numbers allotted and description thereof will not be repeated. Regarding crystallographic denotation herein, an individual orientation, a group orientation, an individual plane, and a group plane are shown in [ ], < >, ( ), and { }, respectively. Although a crystallographically negative index is normally expressed by a number with a bar "–" thereabove, a negative sign herein precedes a number to indicate a crystallographically negative index. In addition, angles are described using a system having an omnidirectional angle of 360 degrees.

First Embodiment

Figure 1:
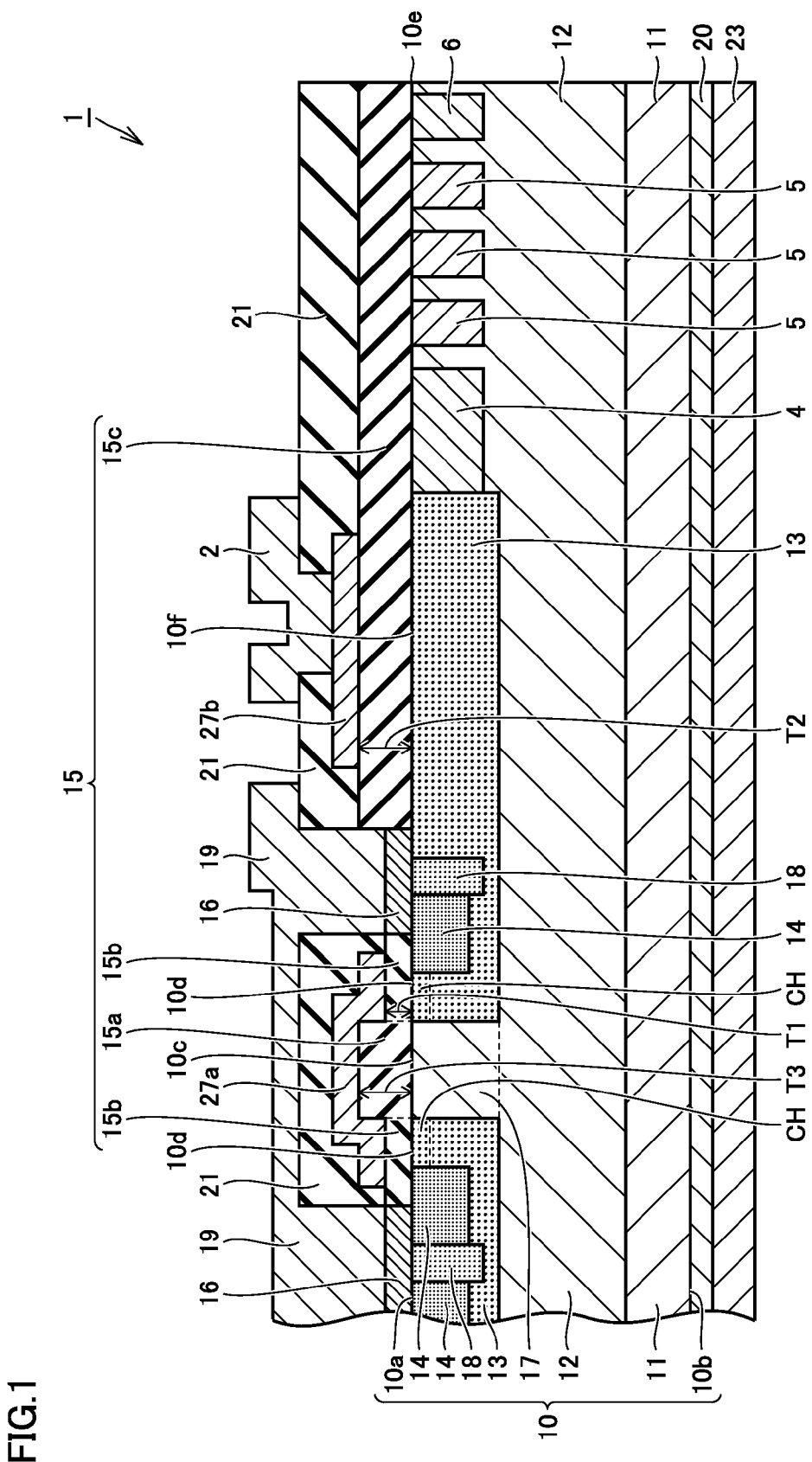
FIG. 1 is a schematic sectional view schematically showing the structure of a silicon carbide semiconductor device according to a first embodiment of the present invention.

Referring to FIG. 1, a MOSFET 1 which is a silicon carbide semiconductor device in a first embodiment mainly includes a silicon carbide substrate 10, a silicon dioxide layer 15, a gate electrode 27, a source contact electrode 16, a drain electrode 20, and a gate runner 2.

Silicon carbide substrate 10 includes a first main surface 10a and a second main surface 10b facing each other, and is made of hexagonal silicon carbide of polytype 4H, for example. First main surface 10a of silicon carbide substrate 10 may be angled off at approximately not more than 8° relative to a (0001) plane, for example, and may be a (0-33-8) plane. Preferably, first main surface 10a is a plane macroscopically having an off angle of 62°±10° relative to a {000-1} plane.

Silicon carbide substrate 10 mainly includes a base substrate 11, a drift layer 12, a well region 13, a second impurity region 14, and a p+ region 18. The base substrate is an epitaxial layer made of silicon carbide and having n type conductivity (first conductivity type). Drift layer 12 is arranged on base substrate 11, and has n type conductivity. Drift layer 12 contains an impurity such as nitrogen (N). A nitrogen concentration in drift layer 12 is approximately $5 \times 10^{15}$ cm$^{-3}$, for example. Drift layer 12 includes a first impurity region 17. First impurity region 17 is a JFET region which is part of drift layer 12 and which is sandwiched between a pair of well regions 13 that will be described later. Drift layer 12 and first impurity region 17 have the same conductivity type.

Well region 13 is in contact with first impurity region 17, and has p type conductivity (second conductivity type) different from the n type conductivity (first conductivity type). The pair of well regions 13 is arranged so as to sandwich first impurity region 17 therebetween, and contains an impurity such as aluminum (Al) or boron (B). An aluminum or boron concentration in well region 13 is approximately $1 \times 10^{17}$ cm$^{-3}$, for example.

Second impurity region 14 is a source region separated from first impurity region 17 by well region 13. Second impurity region 14 has n type conductivity (first conductivity type). Second impurity region 14 is formed within each of the pair of well regions 13 so as to include first main surface 10a and be surrounded by well region 13. Second impurity region 14 contains an impurity such as phosphorus (P) in higher concentration (density) than that of the impurity contained in drift layer 12. The phosphorus concentration in second impurity region 14 is approximately $1 \times 10^{20}$ cm$^{-3}$, for example.

P+ region 18 is formed within each of the pair of well regions 13 so as to include first main surface 10a, be surrounded by well region 13, and be adjacent to second impurity region 14. P+ region 18 is arranged in contact with source contact electrode 16, second impurity region 14 and well region 13. P+ region 18 contains an impurity such as Al in higher concentration (density) than that of the impurity contained in well region 13. The Al concentration in p+ region 18 is approximately $1 \times 10^{20}$ cm$^{-3}$, for example.

A gate insulating film is a region including a third silicon dioxide region 15a arranged in contact with a surface 10c of first impurity region 17, and a first silicon dioxide region 15b arranged in contact with a first region 10d of well region 13.

A thickness T3 of third silicon dioxide region 15a is greater than a thickness T1 of first silicon dioxide region 15b. Thickness T1 of third silicon dioxide region 15a on first impurity region 17 is approximately 180 nm, for example, and thickness T1 of first silicon dioxide region 15b on well region 13 is approximately 50 nm, for example. Preferably, thickness T3 of third silicon dioxide region 15a is 1.5 times or more and 5 times or less thickness T1 of first silicon dioxide region 15b.

In MOSFET 1 of this embodiment, a channel region CH can be formed in a position facing first silicon dioxide region 15b within well region 17 sandwiched between first impurity region 17 and second impurity region 14. In other words, first silicon dioxide region 15b is arranged on and in contact with channel region CH.

First main surface 10a of silicon carbide substrate 10 includes first region 10d in contact with channel region CH sandwiched between first impurity region 17 and second impurity region 14, and a second region 10f different from first region 10d. First silicon dioxide region 15b is arranged on first region 10d of first main surface 10a, and a second silicon dioxide region 15c is arranged on second region 10f of first main surface 10a.

A thickness T2 of second silicon dioxide region 15c is greater than thickness T1 of first silicon dioxide region 15b. Preferably, thickness T2 of second silicon dioxide region 15c is 1.5 times or more and 5 times or less thickness T1 of first silicon dioxide region 15b.

A carbon concentration in first silicon dioxide region 15b is higher than a carbon concentration in second silicon dioxide region 15c. Preferably, the carbon concentration in first silicon dioxide region 15b is higher than a carbon concentration in third silicon dioxide region 15a. The carbon concentration in first silicon dioxide region 15b is approximately not less than $1 \times 10^{18}$ cm$^{-3}$ and approximately not more than $1 \times 10^{20}$ cm$^{-3}$, for example, and the carbon concentrations in second silicon dioxide region 15c and third silicon dioxide region 15a are approximately not less than $1 \times 10^{17}$ cm$^{-3}$ and approximately not more than $1 \times 10^{19}$ cm$^{-3}$, for example. The carbon concentrations in first silicon dioxide region 15b, second silicon dioxide region 15c and third silicon dioxide region 15a can be measured by SIMS (Secondary Ion Mass Spectrometry), for example.

Gate electrode 27 includes a gate electrode region 27a arranged on first silicon dioxide region 15b and third silicon dioxide region 15a, and a gate electrode region 27b arranged on second silicon dioxide region 15c. Gate electrode region 27a is arranged in contact with first silicon dioxide region 15b and third silicon dioxide region 15a so as to sandwich first silicon dioxide region 15b and third silicon dioxide region 15a between silicon carbide substrate 10 and gate electrode region 27a. In addition, gate electrode 27 is formed of a conductor such as polysilicon doped with an impurity or Al (aluminum). Gate electrode 27 is in contact with first silicon dioxide region 15b and second silicon dioxide region 15c.

Figure 2:
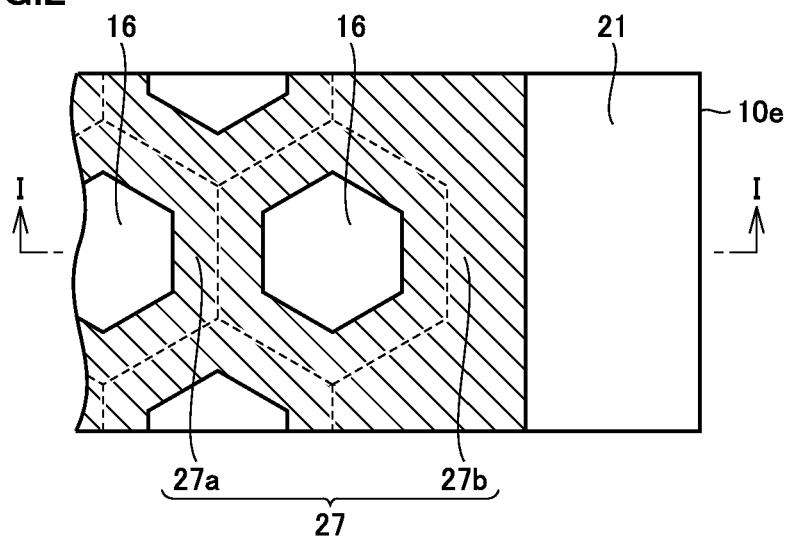
FIG. 2 is a schematic plan view schematically showing the structure of a gate electrode of the silicon carbide semiconductor device according to the first embodiment of the present invention.

As shown in FIG. 2, when viewed from the direction of the normal of first main surface 10a of silicon carbide substrate 10 (hereinafter also referred to as "when viewed two-dimensionally"), gate electrode region 27a and gate electrode region 27b are electrically connected together. Furthermore, when viewed two-dimensionally, gate electrode region 27a and gate electrode region 27b are formed so as to surround source contact electrode 16 which will be described later. Gate electrode 27 is in contact with an interlayer insulating film 21 which will be described later.

Source contact electrode 16 is arranged in contact with second impurity region 14, p+ region 18, and first silicon dioxide region 15b. Source contact electrode 16 is made of a material capable of making ohmic contact with second impurity region 14, such as NiSi (nickel silicide).

Drain electrode 20 is formed in contact with second main surface 10b of silicon carbide substrate 10 opposite to the side where drift layer 12 is formed. This drain electrode 20 is made of a material capable of making ohmic contact with n type base substrate 11, such as NiSi, and is electrically connected to base substrate 11. A pad electrode 23 is arranged in contact with drain electrode 20. Source contact electrode 16 and drain electrode 20 are configured such that a current flowing between source contact electrode 16 and drain electrode 20 can be controlled by gate electrode 27 applied to gate electrode 27.

Interlayer insulating film 21 is formed so as to be in contact with first silicon dioxide region 15b and surround gate electrode region 27a. Interlayer insulating film 21 is made of silicon dioxide which is an insulator, for example. A source wire 19 surrounds interlayer insulating film 21 and extends to an upper surface of source contact electrode 16 on first main surface 10a of silicon carbide substrate 10. Source wire 19 is formed of a conductor such as Al, and is electrically connected to second impurity region 14 via source contact electrode 16.

MOSFET 1 according to this embodiment further includes a JTE (Junction Termination Extension) region 4, a guard ring region 5 and a field stop region 6. JTE region 4 and guard ring region 5 each have the same conductivity type (p type conductivity) as that of well region 13. An impurity concentration in each of JTE region 4 and guard ring region 5 is lower than the impurity concentration in well region 13. JTE region 4 is in contact with well region 13, whereas guard ring region 5 is not in contact with well region 13. When viewed two-dimensionally, guard ring region 5 is arranged on an outer side relative to JTE region 4 so as to surround JTE region 4. A plurality of guard ring regions 5 may be provided.

JTE region 4 and guard ring region 5 each contain an impurity such as boron or aluminum. A dose of this impurity is $1.3 \times 10^{13}$ cm$^{-2}$, for example, and is preferably approximately not less than $8 \times 10^{12}$ cm$^{-2}$ and not more than $1.4 \times 10^{13}$ cm$^{-2}$.

Field stop region 6 has the same conductivity type (n type conductivity) as that of drift layer 12. An impurity concentration in field stop region 6 is higher than the impurity concentration in drift layer 12. The impurity concentration in field stop region 6 is approximately $1.0 \times 10^{18}$ cm$^{-3}$, for example. Field stop region 6 is arranged on an outer side relative to JTE region 4 and guard ring region 5 so as to surround JTE region 4 and guard ring region 5 when viewed two-dimensionally.

Gate runner 2 is made of a material having lower electrical resistivity than that of gate electrode region 27b, such as aluminum, and is electrically connected to gate electrode region 27b. Gate runner 2 is arranged above well region 13 having p type conductivity. More specifically, gate runner 2 is arranged above a region within well region 13 where channel region CH is not formed, with second silicon dioxide region 15c and gate electrode region 27b interposed therebetween.

Figure 3:
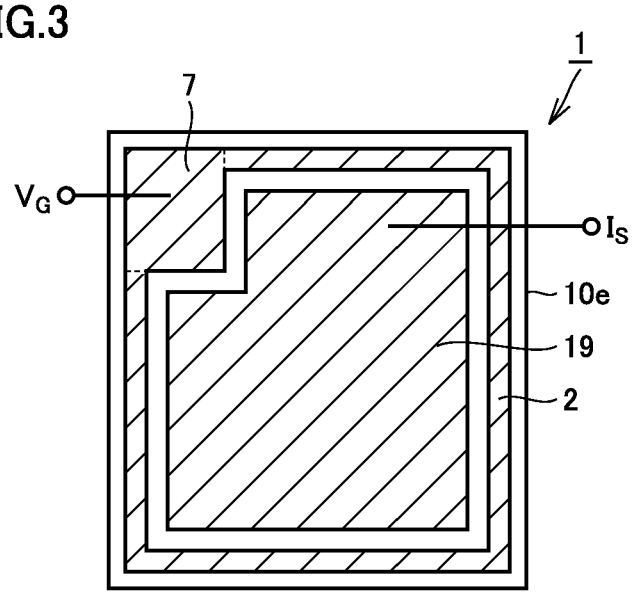
FIG. 3 is a schematic plan view schematically showing the structure of a gate runner of the silicon carbide semiconductor device according to the first embodiment of the present invention.

Referring to FIG. 3, gate runner 2 is arranged so as to be close to an end portion 10e of a chip when viewed two-dimensionally. Gate runner 2 is in contact with a gate pad 7 arranged near a corner portion of the chip. Gate pad 7 is configured such that a gate voltage is externally applied thereto. Gate runner 2 is arranged so as to surround source wire 19 when viewed two-dimensionally. Source wire 19 is configured such that a source current is externally applied thereto.

The operation of MOSFET 1 is now described. Referring to FIG. 1, when a voltage of gate electrode 27 is lower than a threshold voltage, namely, in an off state, a pn junction between well region 13 located immediately below first silicon dioxide region 15b and first impurity region 17 is reverse biased, resulting in a non-conducting state. When a voltage equal to or higher than the threshold voltage is applied to gate electrode 27, on the other hand, an inversion layer is formed in channel region CH near an area where well region 13 and first silicon dioxide region 15b are in contact with each other. As a result, second impurity region 14 and first impurity region 17 are electrically connected together, causing a current to flow between source wire 19 and drain electrode 20.

An example of a method of manufacturing MOSFET 1 in this embodiment is now described with reference to FIGS. 4 to 10.

Figure 4:
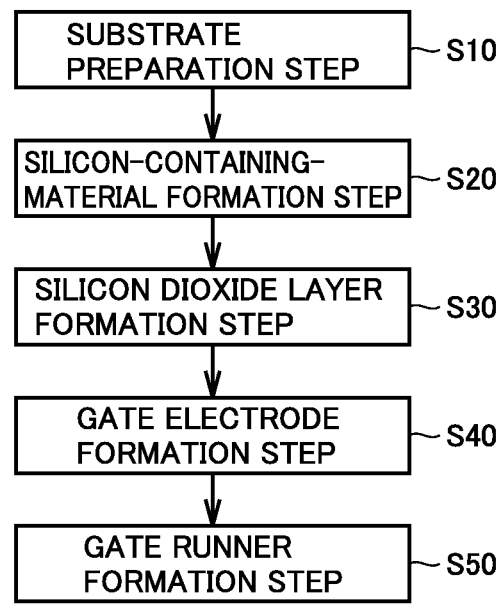
FIG. 4 is a flow diagram schematically showing a method of manufacturing the silicon carbide semiconductor device according to the first embodiment of the present invention.
Figure 5:
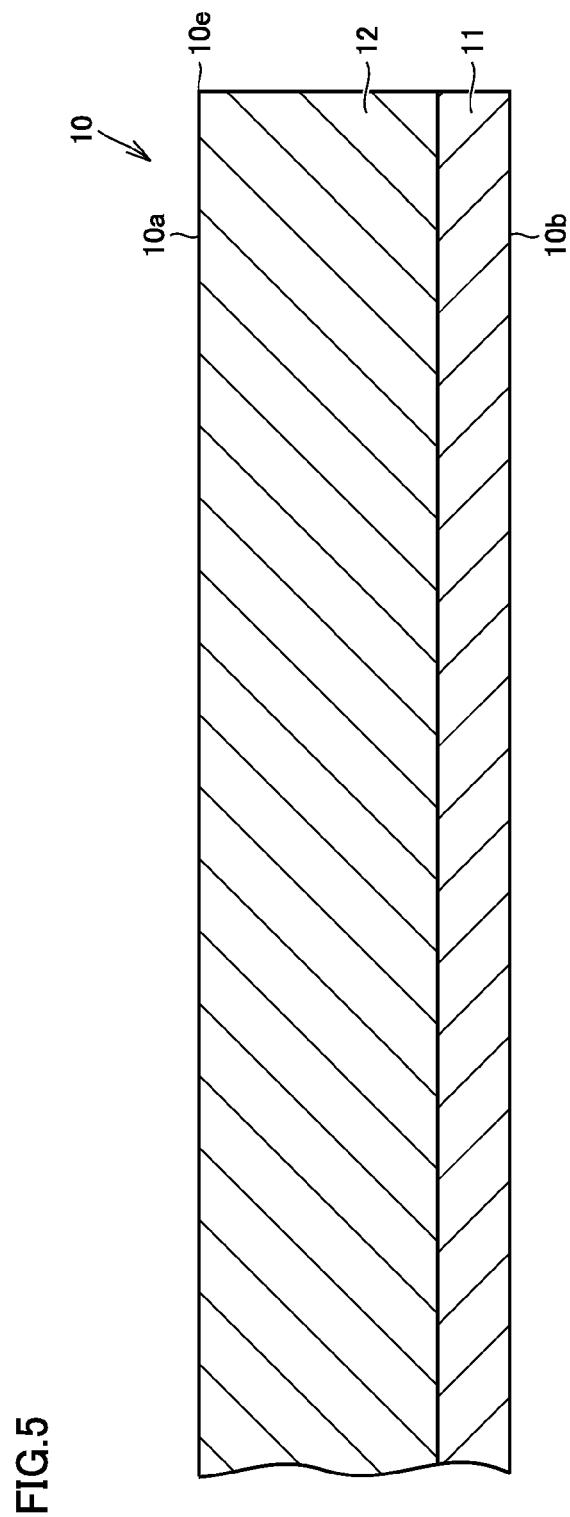
FIG. 5 is a schematic sectional view schematically showing a first step of the method of manufacturing the silicon carbide semiconductor device according to the first embodiment of the present invention.
Figure 6:
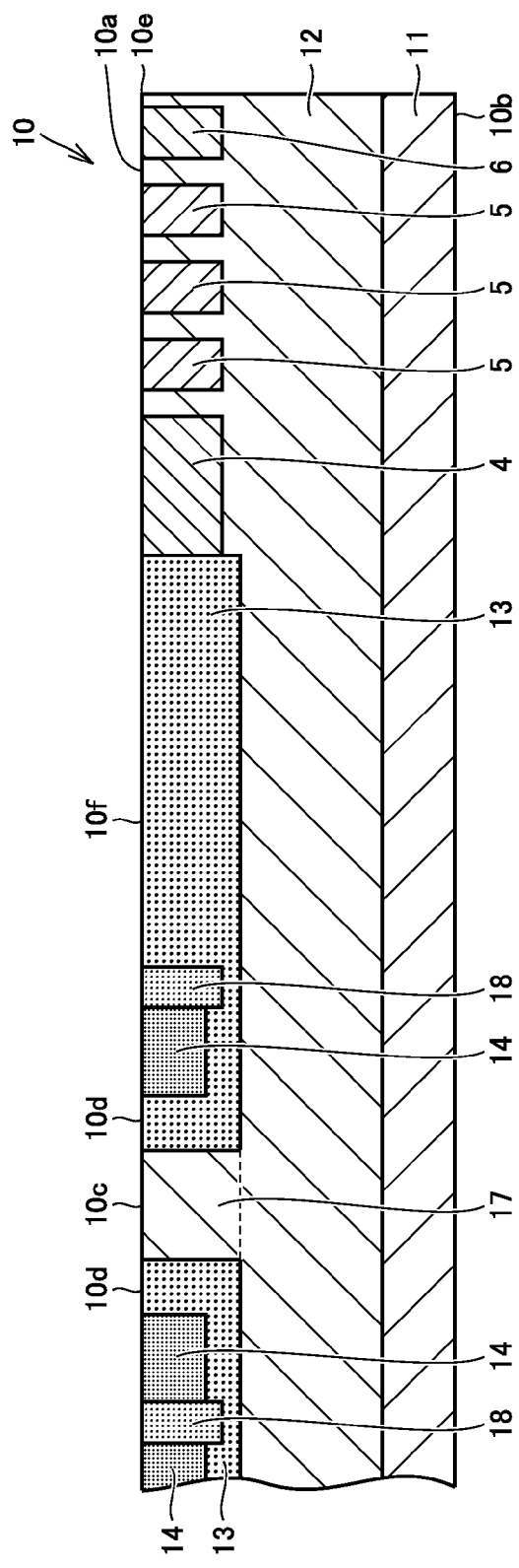
FIG. 6 is a schematic sectional view schematically showing a second step of the method of manufacturing the silicon carbide semiconductor device according to the first embodiment of the present invention.
Figure 7:
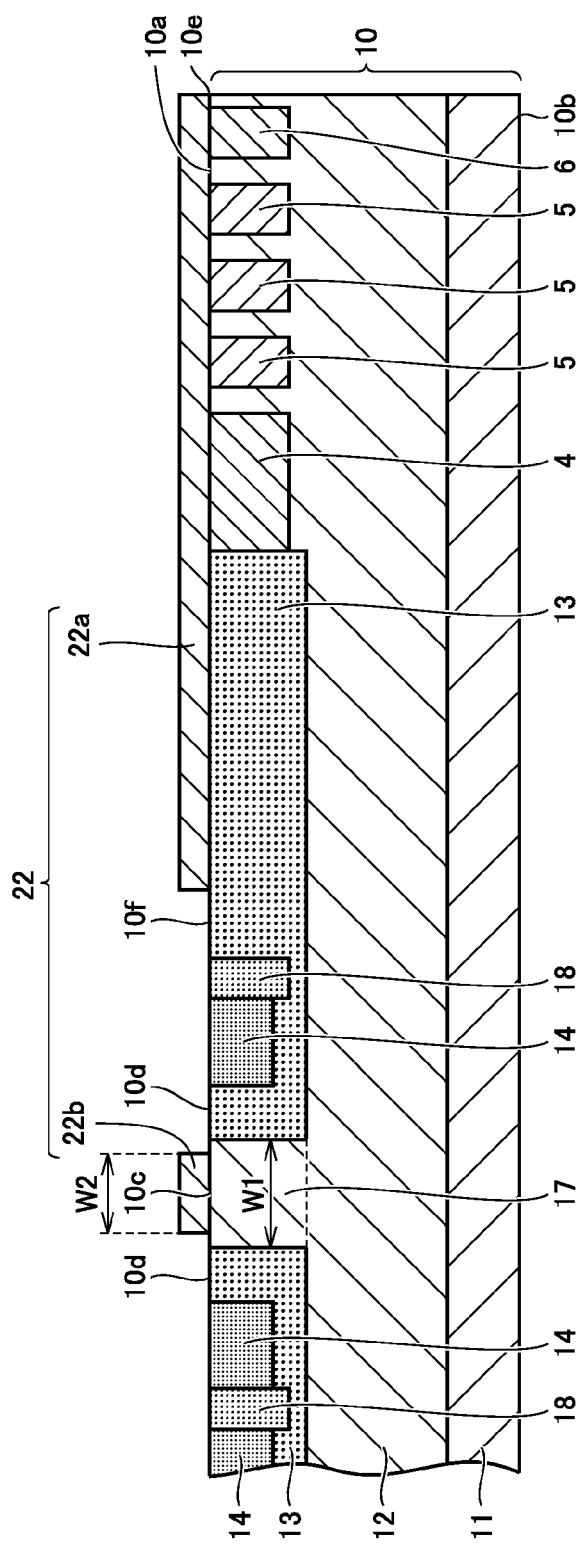
FIG. 7 is a schematic sectional view schematically showing a third step of the method of manufacturing the silicon carbide semiconductor device according to the first embodiment of the present invention.

First, a substrate preparation step (S10: FIG. 4) is performed. Specifically, referring to FIG. 5, base substrate 11 made of hexagonal silicon carbide of polytype 4H, for example, is prepared, and drift layer 12 having n type conductivity (first conductivity type) is formed on base substrate 11 by epitaxial growth. Drift layer 12 contains an impurity such as N (nitrogen) ions. Silicon carbide substrate 10 having main surface 10a and including drift layer 12 of the first conductivity type is thus prepared. First main surface 10a of silicon carbide substrate 10 may be angled off at approximately 8° relative to the (0001) plane, for example, and may be the (0-33-8) plane. Preferably, first main surface 10a is a plane macroscopically having an off angle of 62°±10° relative to the {000-1} plane.

Next, a well region formation step is performed. Specifically, referring to FIG. 6, well region 13 is formed by implanting Al (aluminum) ions, for example, into drift layer 12. Then, ion implantation for forming second impurity region 14 is performed. Specifically, second impurity region 14 is formed within well region 13 by implanting P (phosphorous) ions, for example, into well region 13. Furthermore, ion implantation for forming p+ region 18 is performed. Specifically, p+ region 18 is formed in contact with second impurity region 14 within well region 13 by implanting Al ions, for example, into well region 13. The aforementioned ion implantations can be performed by forming a mask layer, which is made of silicon dioxide and provided with openings in desired regions where the ion implantations are to be performed, on first main surface 10a of drift layer 12, for example.

Similarly, JTE region 4 and guard ring region 5 are formed by implanting Al (aluminum) ions, for example, into drift layer 12, and field stop region 6 is formed by implanting P (phosphorous) ions, for example, into drift layer 12.

As described above, silicon carbide substrate 10 including first impurity region 17 having n type conductivity, well region 13 being in contact with first impurity region 17 and having p type conductivity different from the n type conductivity, second impurity region 14 separated from first impurity region 17 by well region 13 and having n type conductivity, JTE region 4 in contact with well region 13, guard ring region 5, and field stop region 6 (see FIG. 6) is prepared. Silicon carbide substrate 10 includes first main surface 10a and second main surface 10b facing each other. First main surface 10a includes first region 10d in contact with channel region CH sandwiched between first impurity region 17 and second impurity region 14 (see FIG. 1), and second region 10f different from first region 10d.

Next, an activation annealing step is performed. Specifically, heat treatment is conducted in which silicon carbide substrate 10 is heated to approximately 1700° C., for example, and held for approximately 30 minutes in an inert gas atmosphere such as argon. This activates the implanted impurities.

Next, a silicon-containing-material formation step (S20: FIG. 4) is performed. Specifically, referring to FIG. 7, a silicon-containing material 22a is formed so as to be in contact with well region 13, JTE region 4, guard ring region 5, and field stop region 6. Preferably, a silicon-containing material 22 is formed so as to be in contact with end portion 10e of first main surface 10a of silicon carbide substrate 10. Silicon-containing material 22 is also formed in contact with second region 10f, which is different from first region 10d in contact with channel region CH (see FIG. 1). In this embodiment, a silicon-containing material 22b is also formed on surface 10c of first impurity region 17 sandwiched between the pair of well regions 13.

Silicon-containing materials 22a and 22b are, for example, polysilicon, amorphous silicon, amorphous silicon carbide and the like, and may be single-crystal silicon. Preferably, silicon-containing material 22 is a material mainly composed of silicon. More preferably, silicon-containing material 22 is a material more readily oxidized than silicon carbide. Silicon-containing material 22 has a thickness of approximately 60 nm, for example. First impurity region 17 is a JFET region.

In the step of forming the silicon-containing material, silicon-containing material 22a is formed on second region 10f, and silicon-containing material 22b is formed on surface 10c of silicon carbide substrate 10 in contact with first impurity region 17, by depositing polysilicon on first main surface 10a of silicon carbide substrate 10 and then patterning it by wet etching or dry etching, for example.

Preferably, a width W2 of the silicon-containing material formed on surface 10c of first impurity region 17 (the distance in a direction parallel to surface 10c) is smaller than a width W1 of the first impurity region (namely, the shortest distance between the pair of well regions 13). Width W1 of the first impurity region is not less than approximately 2.5 μm and not more than approximately 3.0 μm, for example.

Next, a silicon dioxide layer formation step (S30: FIG. 4) is performed. The silicon dioxide layer formation step includes a step of forming first silicon dioxide region 15b which will be part of the gate insulating film on first region 10d, and a step of forming second silicon dioxide region 15c by oxidizing silicon-containing material 22a. Specifically, second silicon dioxide region 15c and third silicon dioxide region 15a are formed by oxidizing silicon-containing material 22a on second region 10f and silicon-containing material 22b (a second silicon-containing region) formed on surface 10c of first impurity region 17, respectively. Similarly, first silicon dioxide region 15b is formed by oxidizing first region 10d of well region 13 sandwiched between first impurity region 17 and second impurity region 14. More specifically, heat treatment is conducted in which silicon carbide substrate 10 having silicon-containing materials 22a and 22b formed thereon and exposed at first region 10d of well region 13 is heated to approximately 1300° C., for example, and held for approximately one hour in an oxygen atmosphere.

Figure 8:
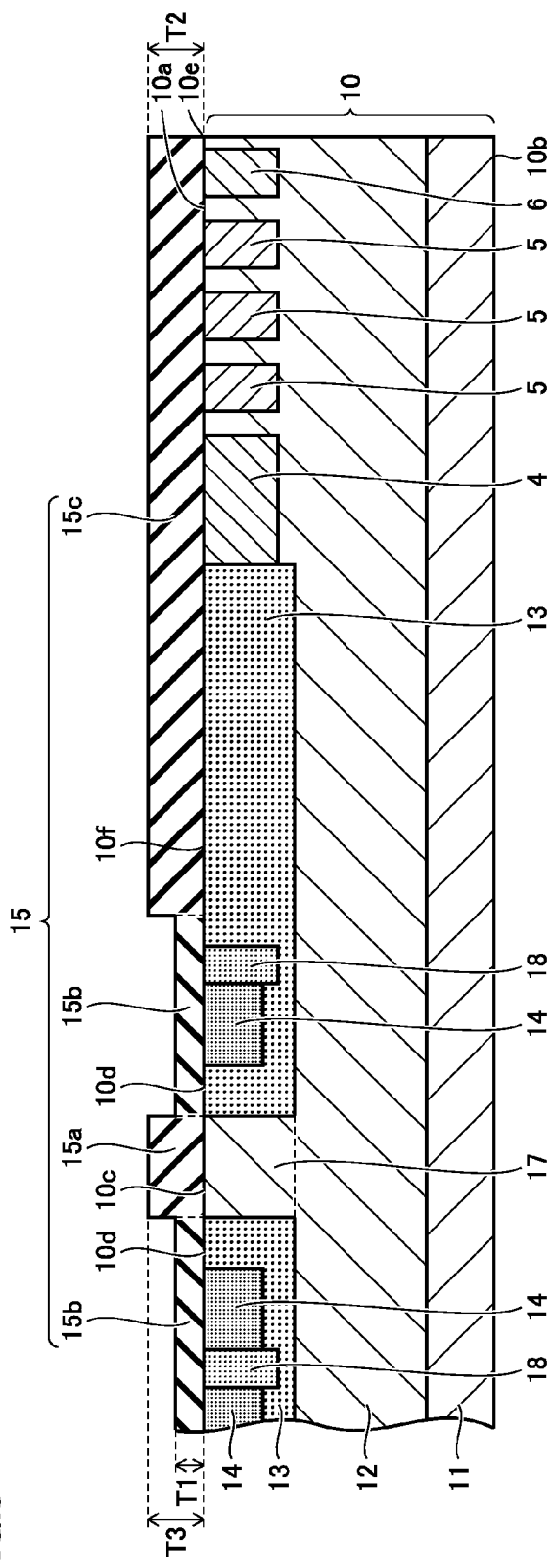
FIG. 8 is a schematic sectional view schematically showing a fourth step of the method of manufacturing the silicon carbide semiconductor device according to the first embodiment of the present invention.
Figure 9:
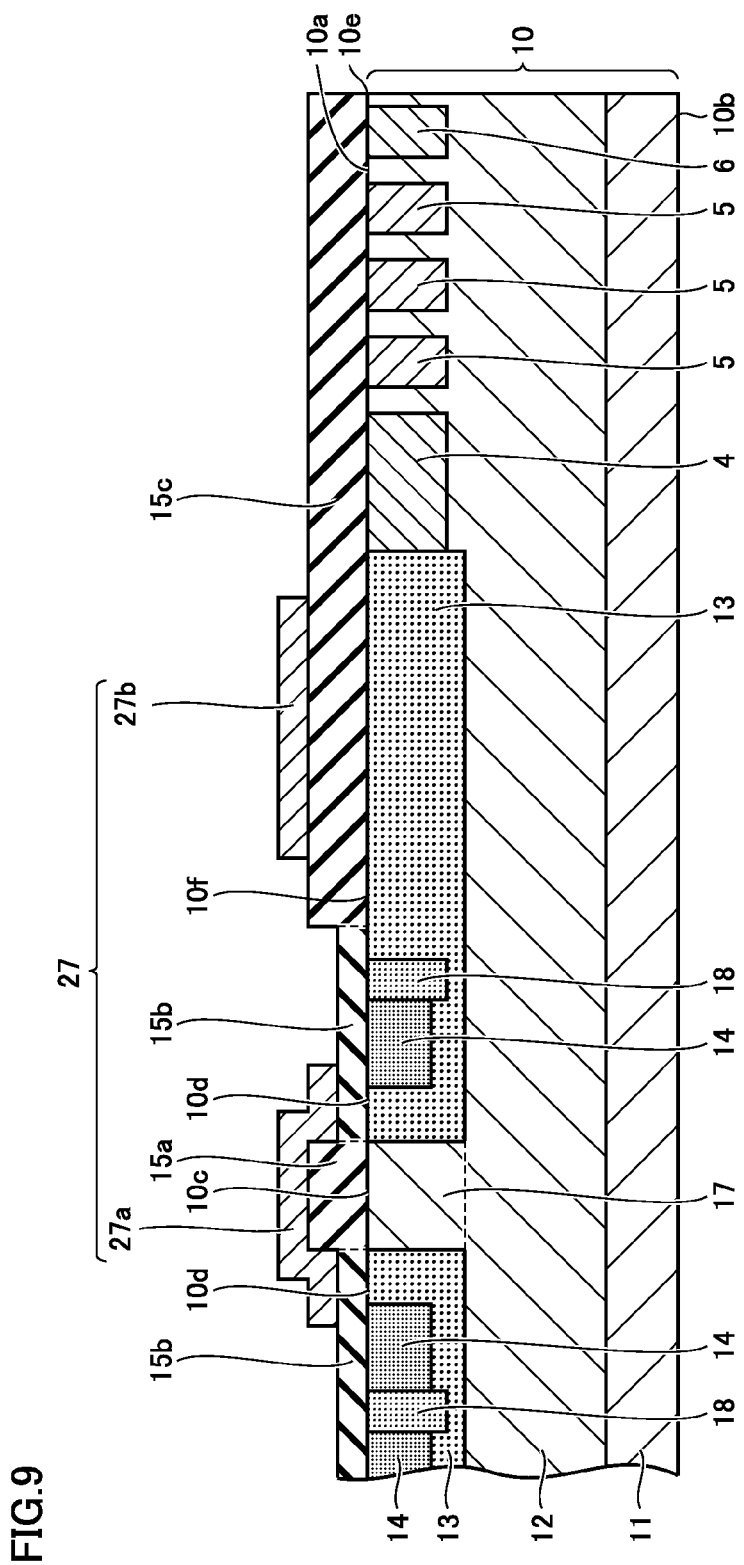
FIG. 9 is a schematic sectional view schematically showing a fifth step of the method of manufacturing the silicon carbide semiconductor device according to the first embodiment of the present invention.

Referring to FIG. 8, silicon dioxide layer 15 includes third silicon dioxide region 15a on surface 10c of first impurity region 17, first silicon dioxide region 15b on first region 10d of well region 13 sandwiched between first impurity region 17 and second impurity region 14, and second silicon dioxide region 15c on second region 10f. Assuming that the thickness of first silicon dioxide region 15b is first thickness T1 and the thickness of second silicon dioxide region 15c is second thickness T2, second thickness T2 is greater than first thickness T1. For example, first thickness T1 is approximately 50 nm, and second thickness T2 is approximately 180 nm. Preferably, assuming that the thickness of third silicon dioxide region 15a is third thickness T3, third thickness T3 is greater than first thickness T1. Second thickness T2 and third thickness T3 are approximately equal to each other.

Preferably, thickness T2 of second silicon dioxide region 15c is 1.5 times or more and 5 times or less, and more preferably 3 times or more and 5 times or less, thickness T1 of first silicon dioxide region 15b. Preferably, the carbon concentration in second silicon dioxide region 15c is lower than the carbon concentration in first silicon dioxide region 15b.

In this embodiment, in the step of forming the silicon dioxide layer, the step of oxidizing silicon-containing material 22b arranged on surface 10c of first impurity region 17 and silicon-containing material 22a arranged on second region 10f, and the step of oxidizing first region 10d of well region 13 are simultaneously performed. Silicon-containing materials 22a and 22b are almost completely oxidized to become silicon dioxide, while first region 10d made of silicon carbide of well region 13 is also oxidized to become silicon dioxide. When silicon-containing materials 22a and 22b each have a thickness of approximately 60 nm, for example, the silicon dioxide layers formed by the oxidation of materials 22a and 22b each have a thickness of approximately 180 nm. Preferably, a width W3 of third silicon dioxide region 15a is equal to or smaller than width W1 of first impurity region 17.

When first silicon dioxide region 15b constituting the gate insulating film is formed by oxidizing first main surface 10a of silicon carbide substrate 10, a region of a certain depth from first main surface 10a of silicon carbide substrate 10 is oxidized to become silicon dioxide. Here, the thickness of the silicon dioxide is approximately twice the thickness of the oxidized region of silicon carbide substrate 10.

Then, a nitrogen annealing step is performed. Specifically, silicon carbide substrate 10 is held for approximately one hour, for example, at a temperature of approximately 1100° C. in a nitrogen monoxide atmosphere. Subsequently, heat treatment is conducted in which silicon carbide substrate 10 is heated in an inert gas such as argon or nitrogen. In this heat treatment, silicon carbide substrate 10 is held for approximately one hour at a temperature of not less than 1100° C. and not more than 1500° C.

Figure 10:
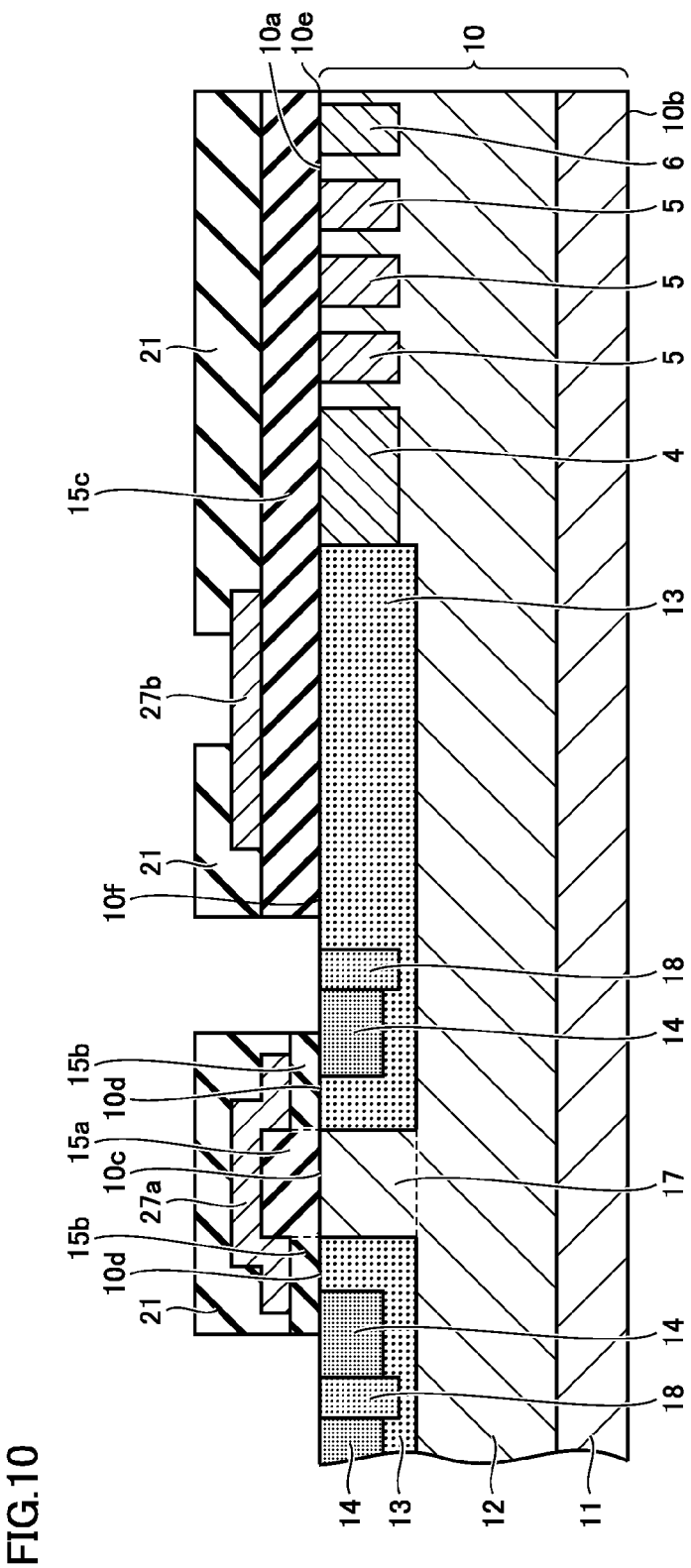
FIG. 10 is a schematic sectional view schematically showing a sixth step of the method of manufacturing the silicon carbide semiconductor device according to the first embodiment of the present invention.

Next, a gate electrode formation step (S40: FIG. 4) is performed. Specifically, referring to FIG. 9, gate electrode 27 made of polysilicon which is a conductor doped with a high concentration of impurity is formed by a CVD (Chemical Vapor Deposition) method, photolithography and etching, for example. Gate electrode 27 includes gate electrode region 27a arranged on first silicon dioxide region 15b and third silicon dioxide region 15a, and gate electrode region 27b arranged on second silicon dioxide region 15c. As shown in FIG. 2, gate electrode region 27a and gate electrode region 27b are electrically connected together. Referring to FIG. 10, subsequently, interlayer insulating film 21 made of silicon dioxide which is an insulator is formed so as to surround gate electrode region 27a by the CVD method, for example. Interlayer insulating film 21 is also formed in contact with gate electrode region 27b so as to expose part of the surface of gate electrode region 27b. Then, part of interlayer insulating film 21 and part of first silicon dioxide region 15b in a region where source contact electrode 16 is to be formed are removed by photolithography and etching.

Next, an ohmic electrode formation step is performed. Specifically, a metal film is formed by vapor deposition, for example, so as to be in contact with second impurity region 14 and p+ region 18 on first main surface 10a of silicon carbide substrate 10. The metal film is made of Ni (nickel), for example. The metal film may include Ti (titanium) atoms and Al (aluminum) atoms, for example. The metal film may include Ni atoms and Si (silicon) atoms, for example. Once formed, the metal film is heated at approximately 1000° C., for example, to heat and silicidize the nickel film to thereby form source contact electrode 16 in ohmic contact with second impurity region 14 of silicon carbide substrate 10. Similarly, a metal film made of Ni or the like is formed in contact with second main surface 10b of silicon carbide substrate 10, and the metal film is heated to form drain electrode 20.

Next, a gate runner formation step (S50: FIG. 4) is performed. Specifically, referring to FIG. 10, gate runner 2 made of Al which is a conductor is electrically connected to gate electrode region 27b, and arranged in a position facing second silicon dioxide region 15c by vapor deposition, for example. Gate runner 2 is in contact with interlayer insulating film 21, and is also electrically connected to gate electrode region 27a via gate electrode region 27b. Gate runner 2 is made of material having lower electrical resistivity than that of gate electrode region 27a. The step of forming the gate runner may include a step of forming gate pad 7 for applying a voltage to gate runner 2.

As shown in FIG. 1, gate runner 2 is preferably formed on an outer side relative to second impurity region 14 and p+ region 18 (so as to be close to end portion 10e of silicon carbide substrate 10). Gate runner 2 is also preferably formed on an inner side relative to JTE region 4, guard ring region 5 and field stop region 6 (so as to be away from end portion 10e of silicon carbide substrate 10). In this embodiment, gate runner 2 is arranged above well region 13 having p type conductivity.

Source wire 19 is formed so as to surround interlayer insulating film 21 and be in contact with source contact electrode 16. Preferably, as shown in FIG. 2, source wire 19 arranged so as to be surrounded by gate runner 2 when viewed two-dimensionally is formed. Gate runner 2 and source wire 19 may be simultaneously formed. In addition, pad electrode 23 made of Al, for example, is formed in contact with drain electrode 20. Following the above procedure completes MOSFET 1 according to this embodiment (see FIG. 1).

While the first conductivity type has been described as n type and the second conductivity type has been described as p type in this embodiment, the present invention is not limited to this embodiment. For example, the first conductivity type may be p type and the second conductivity type may be n type.

While a vertical type MOSFET has been described by way of example as the silicon carbide semiconductor device in this embodiment, the present invention is not limited to this embodiment. For example, the silicon carbide semiconductor device may be a lateral type MOSFET, for example. Alternatively, the MOSFET may be of planar type or trench type. Moreover, the silicon carbide semiconductor device may be an IGBT (Insulated Gate Bipolar Transistor).

A function and effect of MOSFET 1 and the method of manufacturing the same according to this embodiment are now described.

According to MOSFET 1 and the method of manufacturing the same of this embodiment, after silicon-containing material 22a is formed on second region 10f, second silicon dioxide region 15c is formed by oxidizing silicon-containing material 22a. Gate runner 2 is formed in a position facing second silicon dioxide region 15c. Consequently, the insulation performance between silicon carbide substrate 10 and gate runner 2 can be improved while the surface roughness of silicon carbide substrate 10 is suppressed.

Moreover, according to the method of manufacturing MOSFET 1 of this embodiment, the step of forming first silicon dioxide region 15b and the step of forming second silicon dioxide region 15c are performed by simultaneously oxidizing first region 10d and silicon-containing material 22a. Consequently, first silicon dioxide region 15b and second silicon dioxide region 15c are efficiently formed.

Moreover, according to MOSFET 1 and the method of manufacturing the same of this embodiment, second thickness T2 of second silicon dioxide region 15c is 1.5 times or more and 5 times or less first thickness T1 of first silicon dioxide region 15b. When first thickness T1 is 1.5 times or more second thickness T2, the carbon concentration in first silicon dioxide region 15b can be efficiently made higher than the carbon concentration in second silicon dioxide region 15c. When first thickness T1 is 5 times or less second thickness T2, on the other hand, a level difference between gate electrode region 27b formed on second silicon dioxide region 15c and gate electrode region 27a formed on first silicon dioxide region 15b does not become too great, thus allowing gate electrode 27 to be formed without being isolated.

Furthermore, the method of manufacturing MOSFET 1 of this embodiment further includes the step of forming source wire 19 arranged so as to be surrounded by gate runner 2 when viewed two-dimensionally. Consequently, a voltage can be efficiently applied to gate electrode 27 from the entire outer peripheral region of the chip.

Furthermore, according to the method of manufacturing MOSFET 1 of this embodiment, gate runner 2 is formed on an outer side relative to second impurity region 14. Consequently, gate runner 2 is formed on an outer side relative to source wire 19.

Furthermore, according to the method of manufacturing MOSFET 1 of this embodiment, gate runner 2 is formed on an inner side relative to JTE region 4. Consequently, deterioration in breakdown voltage of MOSFET 1 can be suppressed.

Furthermore, according to the method of manufacturing MOSFET 1 of this embodiment, second silicon dioxide region 15c is formed so as to be in contact with end portion 10e of first main surface 10a. Consequently, the breakdown voltage between gate runner 2 and silicon carbide substrate 10 can be further improved.

Furthermore, the method of manufacturing MOSFET 1 of this embodiment further includes the step of forming second silicon-containing material 22b in contact with first impurity region 17, and the step of forming third silicon dioxide region 15a by oxidizing second silicon-containing material 22b. Consequently, a thick silicon dioxide region is formed on first impurity region 17. As a result, the capacitance in the vicinity of the gate insulating film is reduced, thereby improving the switching characteristics of MOSFET 1.

Furthermore, according to the method of manufacturing MOSFET 1 of this embodiment, the step of forming second silicon dioxide region 15c and the step of forming third silicon dioxide region 15a are simultaneously performed. Consequently, second silicon dioxide region 15c and third silicon dioxide region 15a are efficiently formed.

Second Embodiment

Figure 11:
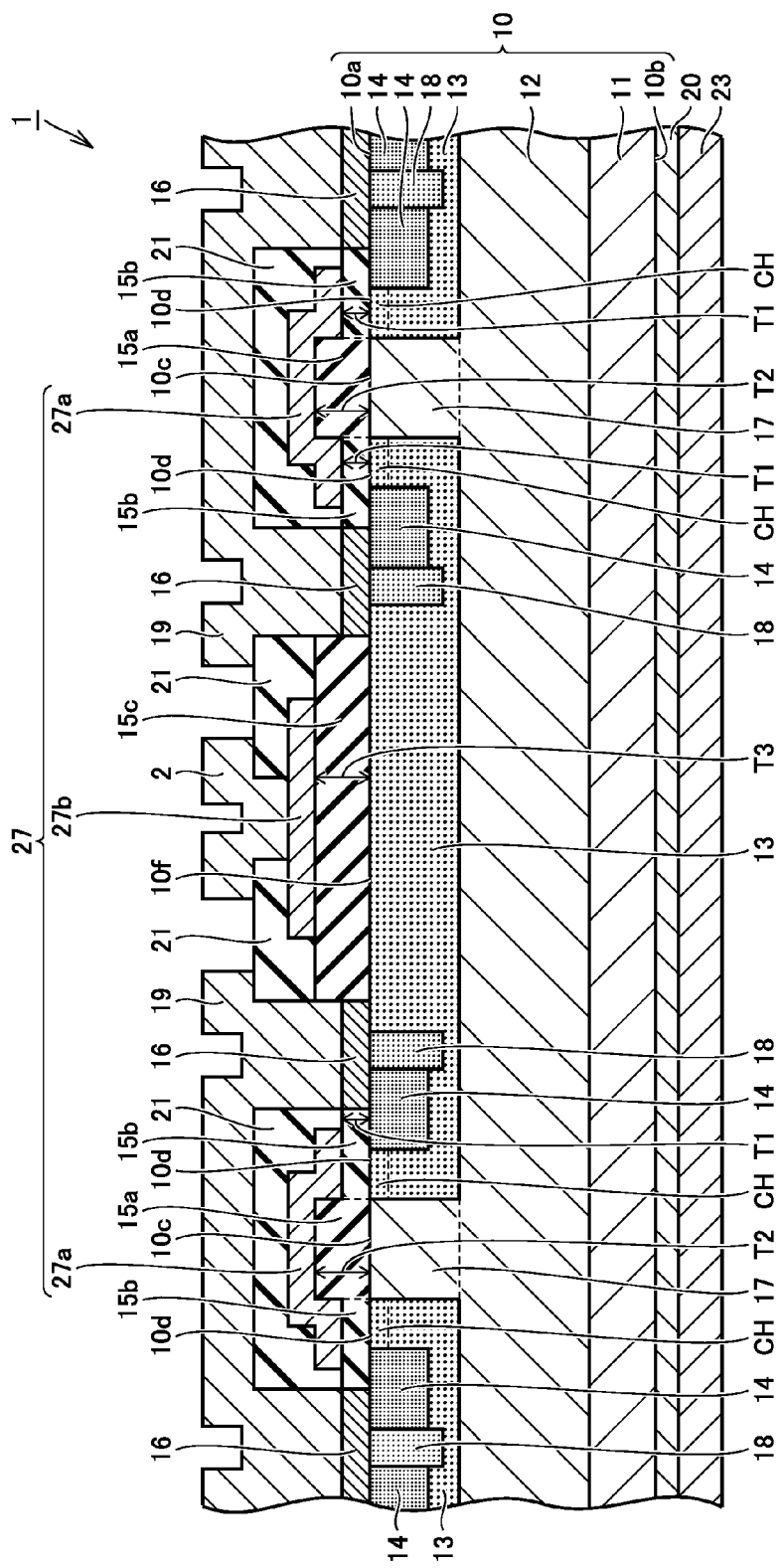
FIG. 11 is a schematic sectional view schematically showing the structure of a silicon carbide semiconductor device according to a second embodiment of the present invention.
Figure 12:
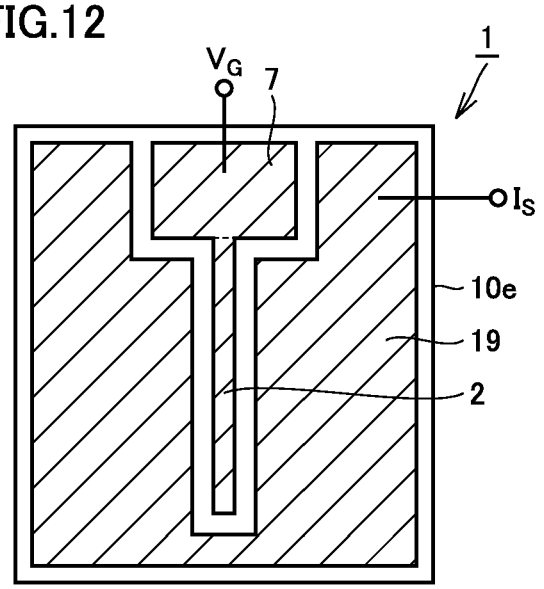
FIG. 12 is a schematic plan view schematically showing the structure of a gate runner of the silicon carbide semiconductor device according to the second embodiment of the present invention.

Referring to FIGS. 11 and 12, the configuration of MOSFET 1 which is a silicon carbide semiconductor device in a second embodiment is described. MOSFET 1 according to the second embodiment is similar in configuration to MOSFET 1 according to the first embodiment except that gate runner 2 is arranged near the center of the chip.

Referring to FIG. 11, gate runner 2 in MOSFET 1 according to this embodiment is arranged in a position facing second silicon dioxide region 15c sandwiched between two source contact electrodes 16 when viewed in cross section (view of FIG. 11). When viewed in cross section, well region 13 in contact with second silicon dioxide region 15c includes two p+ regions 18 and two second impurity regions 14. When viewed in cross section, each of p+ regions 18 has one end in contact with second impurity region 14 and the other end in contact with well region 13. When viewed in cross section, second impurity region 14 and p+ region 18 are arranged axisymmetrically with respect to the normal of first main surface 10a.

Referring to FIG. 12, gate runner 2 in MOSFET 1 according to this embodiment is arranged to extend linearly near the center of a chip 1 when viewed two-dimensionally. Gate runner 2 is connected to gate pad 7 arranged so as to be close to end portion 10e of chip 1. Gate pad 7 is configured such that a gate voltage is externally applied thereto. Source wire 19 is arranged so as to sandwich gate runner 2 and gate pad 7 therebetween when viewed two-dimensionally. Source wire 19 is configured such that a source current is externally applied thereto.

Figure 18:
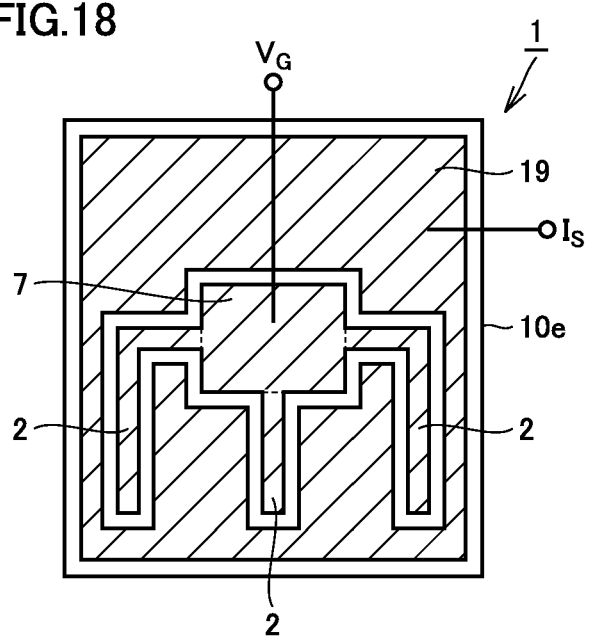
FIG. 18 is a schematic plan view schematically showing the structure of a gate runner of a silicon carbide semiconductor device according to a variation of the second embodiment of the present invention.

Referring to FIG. 18, gate runner 2 may be formed so as to extend from gate pad 7 in a branching manner. Gate pad 7 is arranged near the center of chip 1, and may include a gate runner portion extending linearly at the center of the chip from gate pad 7, and a gate runner portion extending linearly from each of right and left sides of gate pad 7, bent at approximately 90° near end portion 10e of chip 1, and extending along a direction parallel to end portion 10e. Gate runner 2 may be formed so as to be surrounded by source wire 19.

An example of a method of manufacturing MOSFET 1 in this embodiment is now described with reference to FIGS. 13 to 17.

First, a substrate preparation step (S10: FIG. 4) is performed. Specifically, silicon carbide substrate 10 is prepared with a method similar to the method described in the first embodiment. Specifically, base substrate 11 made of hexagonal silicon carbide of polytype 4H, for example, is prepared, and drift layer 12 having n type conductivity (first conductivity type) is formed on base substrate 11 by epitaxial growth.

Figure 13:
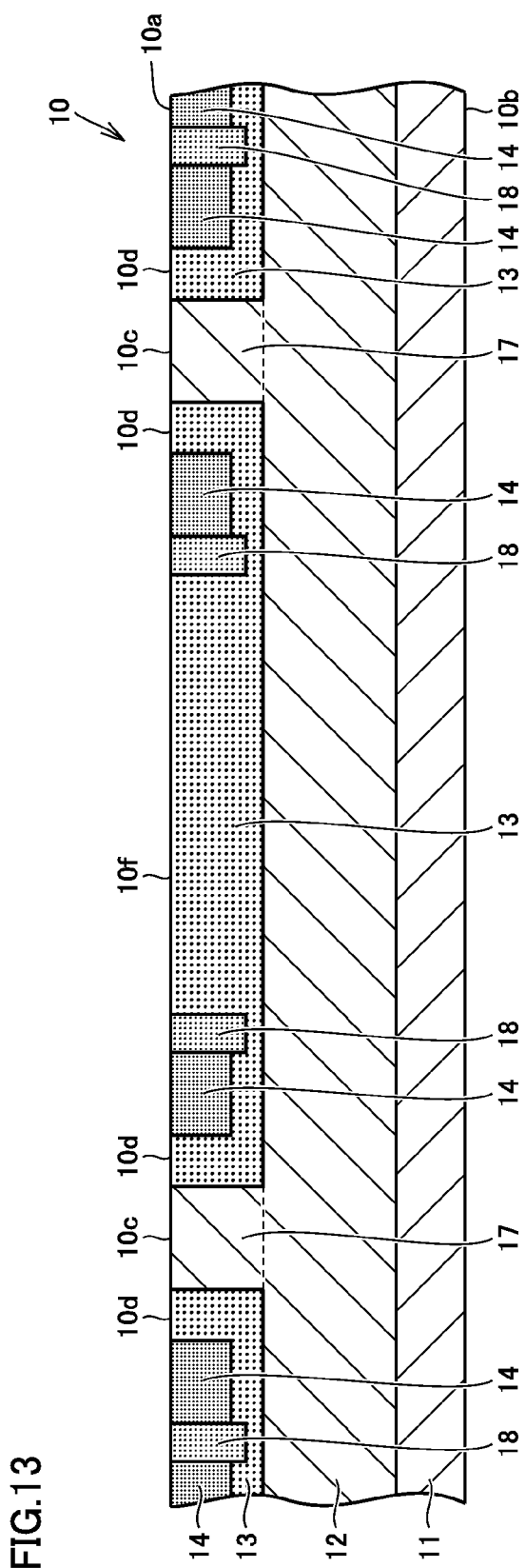
FIG. 13 is a schematic sectional view schematically showing a first step of a method of manufacturing the silicon carbide semiconductor device according to the second embodiment of the present invention.
Figure 14:
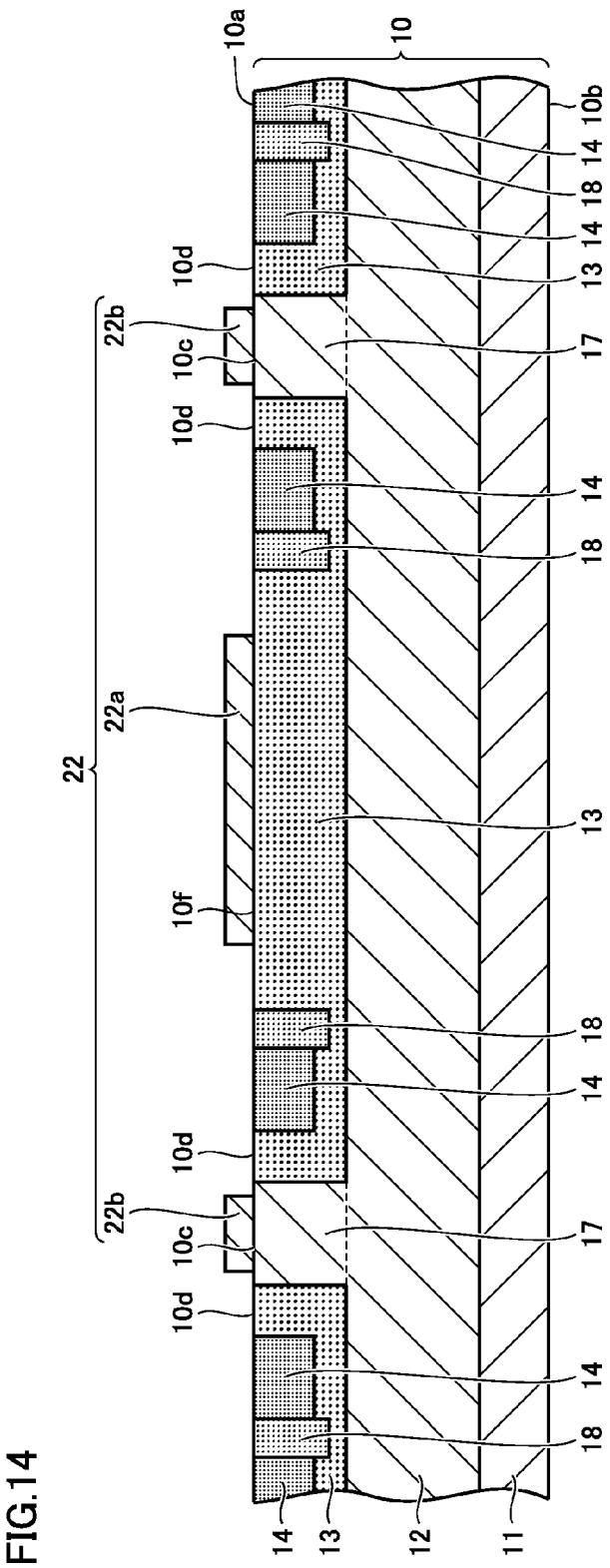
FIG. 14 is a schematic sectional view schematically showing a second step of the method of manufacturing the silicon carbide semiconductor device according to the second embodiment of the present invention.

Referring to FIG. 13, next, well region 13 is formed by implanting Al (aluminum) ions, for example, into drift layer 12. Then, ion implantation for forming second impurity region 14 is performed. Specifically, second impurity region 14 is formed within well region 13 by implanting P (phosphorous) ions, for example, into well region 13. Furthermore, ion implantation for forming p+ region 18 is performed. Specifically, p+ region 18 is formed in contact with second impurity region 14 within well region 13 by implanting Al ions, for example, into well region 13. The aforementioned ion implantations can be performed by forming a mask layer, which is made of silicon dioxide and provided with openings in desired regions where the ion implantations are to be performed, on first main surface 10a of drift layer 12, for example.

As described above, silicon carbide substrate 10 including first impurity region 17 having n type conductivity, well region 13 being in contact with first impurity region 17 and having p type conductivity different from the n type conductivity, and second impurity region 14 separated from first impurity region 17 by well region 13 and having n type conductivity is prepared. Silicon carbide substrate 10 includes first main surface 10a and second main surface 10b facing each other. First main surface 10a includes first region 10d in contact with channel region CH sandwiched between first impurity region 17 and second impurity region 14, and second region 10f different from first region 10d.

Next, an activation annealing step is performed. Specifically, heat treatment is conducted in which silicon carbide substrate 10 is heated to approximately 1700° C., for example, and held for approximately 30 minutes in an inert gas atmosphere such as argon. This activates the implanted impurities.

Next, a silicon-containing-material formation step (S20: FIG. 4) is performed. Specifically, referring to FIG. 14, silicon-containing material 22a is formed on a region across p+ region 18 from the second impurity region within well region 13. This region includes second region 10f, which is different from first region 10d in contact with channel region CH (see FIG. 11). In this embodiment, silicon-containing material 22b is also formed on surface 10c of first impurity region 17 sandwiched between the pair of well regions 13.

Silicon-containing materials 22a and 22b are, for example, polysilicon, amorphous silicon, amorphous silicon carbide and the like, and may be single-crystal silicon. Preferably, silicon-containing material 22 is a material mainly composed of silicon. More preferably, silicon-containing material 22 is a material more readily oxidized than silicon carbide. Silicon-containing material 22 has a thickness of approximately 60 nm, for example. First impurity region 17 is a JFET region.

In the step of forming the silicon-containing material, silicon-containing material 22a is formed on second region 10f, and silicon-containing material 22b is formed on surface 10c of silicon carbide substrate 10 in contact with first impurity region 17, by depositing polysilicon on first main surface 10a of silicon carbide substrate 10 and then patterning it by wet etching or dry etching, for example.

Next, a silicon dioxide layer formation step (S30: FIG. 4) is performed. The silicon dioxide layer formation step includes a step of forming first silicon dioxide region 15b which will be part of the gate insulating film on first region 10d, and a step of forming second silicon dioxide region 15c by oxidizing silicon-containing material 22a. Specifically, second silicon dioxide region 15c and third silicon dioxide region 15a are formed by oxidizing silicon-containing material 22a on second region 10f and silicon-containing material 22b formed on surface 10c of first impurity region 17, respectively. Similarly, first silicon dioxide region 15b is formed by oxidizing first region 10d of well region 13 sandwiched between first impurity region 17 and second impurity region 14. More specifically, heat treatment is conducted in which silicon carbide substrate 10 having silicon-containing materials 22a and 22b formed thereon and exposed at first region 10d of well region 13 is heated to approximately 1300° C., for example, and held for approximately one hour in an oxygen atmosphere.

Figure 15:
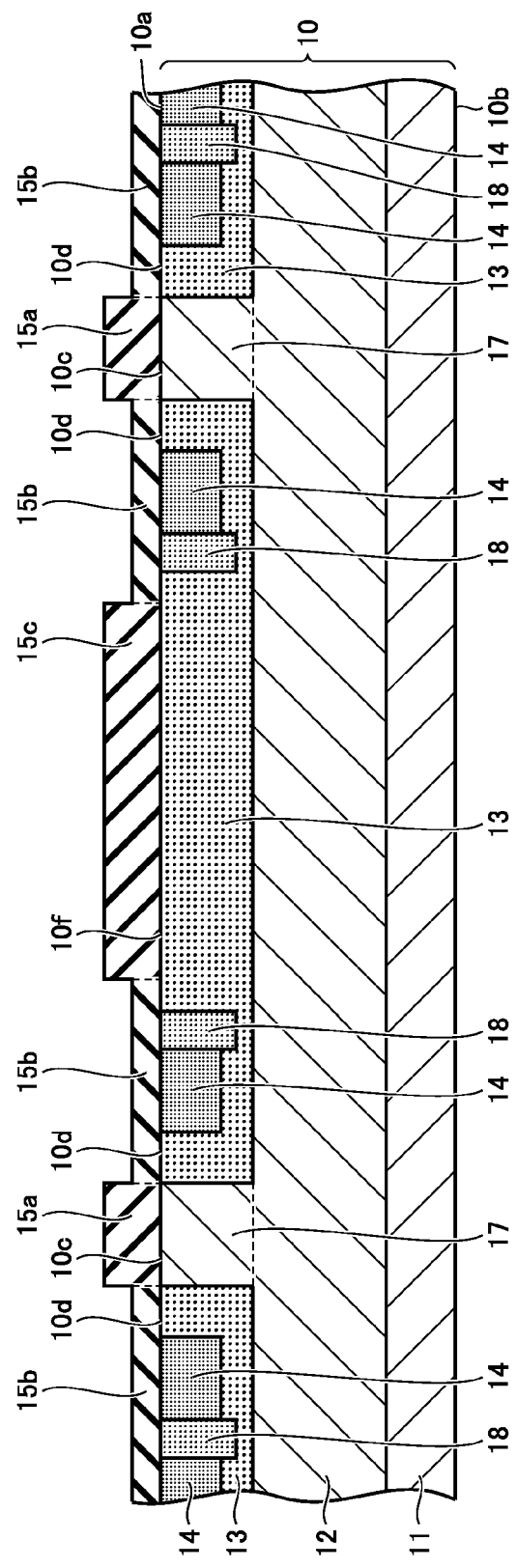
FIG. 15 is a schematic sectional view schematically showing a third step of the method of manufacturing the silicon carbide semiconductor device according to the second embodiment of the present invention.
Figure 16:
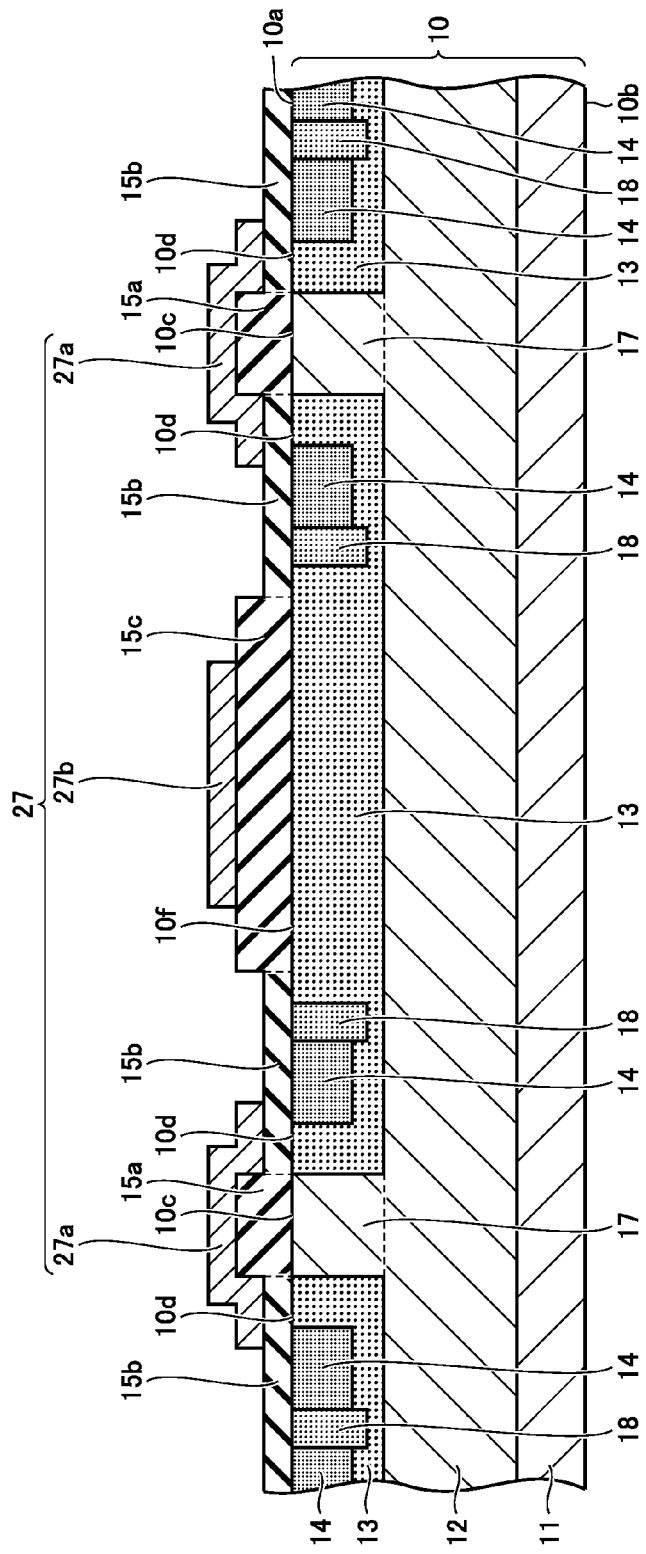
FIG. 16 is a schematic sectional view schematically showing a fourth step of the method of manufacturing the silicon carbide semiconductor device according to the second embodiment of the present invention.

Referring to FIG. 15, silicon dioxide layer 15 includes third silicon dioxide region 15a on surface 10c of first impurity region 17, first silicon dioxide region 15b on first region 10d of well region 13 sandwiched between first impurity region 17 and second impurity region 14, and second silicon dioxide region 15c on second region 10f of first main surface 10a.

In this embodiment, in the step of forming the silicon dioxide layer, the step of oxidizing silicon-containing material 22a arranged on surface 10c of first impurity region 17 and silicon-containing material 22b arranged on second region 10f, and the step of oxidizing first region 10d of well region 13 are simultaneously performed. Silicon-containing materials 22a and 22b are almost completely oxidized to become silicon dioxide, while first region 10d of well region 13 is also oxidized to become silicon dioxide. When silicon-containing materials 22a and 22b each have a thickness of approximately 60 nm, for example, the silicon dioxide layers formed by the oxidation of materials 22a and 22b each have a thickness of approximately 180 nm.

Then, a nitrogen annealing step is performed. Specifically, silicon carbide substrate 10 is held for approximately one hour, for example, at a temperature of approximately 1100° C. in a nitrogen monoxide atmosphere. Subsequently, heat treatment is conducted in which silicon carbide substrate 10 is heated in an inert gas such as argon or nitrogen. In this heat treatment, silicon carbide substrate 10 is held for approximately one hour at a temperature of not less than 1100° C. and not more than 1500° C.

Figure 17:
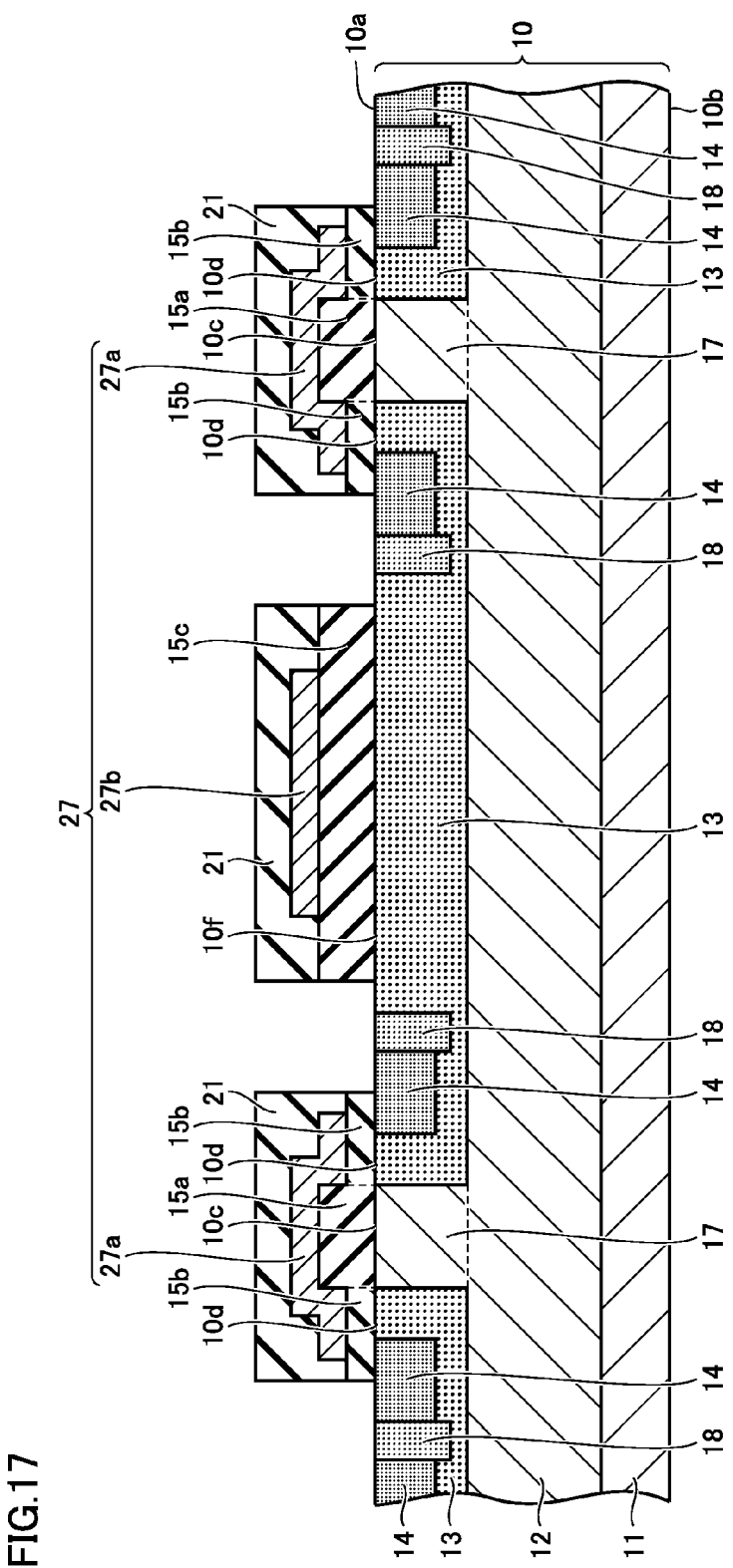
FIG. 17 is a schematic sectional view schematically showing a fifth step of the method of manufacturing the silicon carbide semiconductor device according to the second embodiment of the present invention.

Next, a gate electrode formation step (S40: FIG. 4) is performed. Specifically, referring to FIG. 16, gate electrode 27 made of polysilicon which is a conductor doped with a high concentration of impurity is formed by a CVD method, photolithography and etching, for example. Gate electrode 27 includes gate electrode region 27a arranged on first silicon dioxide region 15b and third silicon dioxide region 15a, and gate electrode region 27b arranged on second silicon dioxide region 15c. Gate electrode region 27a and gate electrode region 27b are electrically connected together. Referring to FIG. 17, subsequently, interlayer insulating film 21 made of silicon dioxide which is an insulator is formed so as to surround gate electrode region 27a by the CVD method, for example. Interlayer insulating film 21 is also formed in contact with gate electrode region 27b so as to expose part of the surface of gate electrode region 27b. Then, part of interlayer insulating film 21 and part of first silicon dioxide region 15b in a region where source contact electrode 16 is to be formed are removed by photolithography and etching.

Next, an ohmic electrode formation step is performed. Specifically, a metal film is formed by vapor deposition, for example, so as to be in contact with second impurity region 14 and p+ region 18 on first main surface 10a of silicon carbide substrate 10. The metal film is made of Ni (nickel), for example. The metal film may include Ti (titanium) atoms and Al (aluminum) atoms, for example. The metal film may include Ni atoms and Si (silicon) atoms, for example. Once formed, the metal film is heated at approximately 1000° C., for example, to heat and silicidize the nickel film to thereby form source contact electrode 16 in ohmic contact with second impurity region 14 of silicon carbide substrate 10. Similarly, a metal film made of Ni or the like is formed in contact with second main surface 10b of silicon carbide substrate 10, and the metal film is heated to form drain electrode 20.

Next, a gate runner formation step (S50: FIG. 4) is performed. Specifically, referring to FIG. 11, gate runner 2 made of Al which is a conductor is electrically connected to gate electrode region 27b, and arranged in a position facing second silicon dioxide region 15c by vapor deposition, for example. Gate runner 2 is in contact with interlayer insulating film 21, and is also electrically connected to gate electrode region 27a via gate electrode region 27b. Gate runner 2 is made of material having lower electrical resistivity than that of gate electrode region 27a. The step of forming the gate runner may include a step of forming gate pad 7 for applying a voltage to gate runner 2.

As shown in FIG. 11, gate runner 2 is formed in contact with gate electrode region 27b in a position facing second silicon dioxide region 15c. Gate runner 2 is formed between two source wires 19 and 19 when viewed in cross section.

Source wire 19 is formed so as to surround interlayer insulating film 21 and be in contact with source contact electrode 16. Preferably, as shown in FIG. 12, source wire 19 is formed so as to sandwich gate runner 2 and gate pad 7 therebetween when viewed two-dimensionally. Gate runner 2 and source wire 19 may be simultaneously formed. In addition, pad electrode 23 made of Al, for example, is formed in contact with drain electrode 20. Following the above procedure completes MOSFET 1 according to this embodiment (see FIG. 11).

It is noted that the conditions and the like in the steps that have not been described in the method of manufacturing MOSFET 1 in the second embodiment are similar to those in the method of manufacturing MOSFET 1 in the first embodiment.

A function and effect of MOSFET 1 and the method of manufacturing the same according to this embodiment are now described.

The method of manufacturing MOSFET 1 of this embodiment further includes the step of forming source wire 19 arranged so as to sandwich gate runner 2 therebetween when viewed two-dimensionally. Consequently, a voltage can be applied to gate electrode 27 from an area near the center of chip 1.

Furthermore, according to the method of manufacturing MOSFET 1 of this embodiment, the step of forming gate runner 2 includes the step of forming gate pad 7 for applying a voltage to gate runner 2. Gate runner 2 is formed so as to extend from gate pad 7 in a branching manner. Consequently, gate runner 2 can be arranged close to gate electrode 27 to thereby efficiently apply a voltage to gate electrode 27.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST

1 MOSFET (chip); 2 gate runner; 4 JTE region; 5 guard ring region; 6 field stop region; 7 gate pad; 10 silicon carbide substrate; 10a first main surface; 10b second main surface; 10c surface; 10d first region; 10f second region; 10e end portion; 11 base substrate; 12 drift layer; 13 well region; 14 second impurity region; 15 silicon dioxide layer; 15a third silicon dioxide region; 15b first silicon dioxide region; 15c second silicon dioxide region; 16 source contact electrode; 17 first impurity region (JFET region); 18 p+ region; 19 source wire; 20 drain electrode; 21 interlayer insulating film; 22, 22a, 22b silicon-containing material; 23 pad electrode; 27, 27a, 27b gate electrode; CH channel region; T1 first thickness; T2 second thickness; T3 third thickness; W1, W2, W3 width.

The invention claimed is:

1. A method of manufacturing a silicon carbide semiconductor device, comprising the step of preparing a silicon carbide substrate including a first main surface and a second main surface facing each other,
   said silicon carbide substrate including a first impurity region having a first conductivity type, a well region being in contact with said first impurity region and having a second conductivity type different from said first conductivity type, and a second impurity region separated from said first impurity region by said well region and having said first conductivity type,
   said first main surface including a first region in contact with a channel region sandwiched between said first impurity region and said second impurity region, and a second region different from said first region,
   said method further comprising the steps of:
   forming a silicon-containing-material on said second region, wherein the silicon-containing-material is polysilicon, amorphous silicon, amorphous silicon carbide or single-crystal silicon;
   forming a first silicon dioxide region on said first region;
   forming a second silicon dioxide region by oxidizing said silicon-containing-material;
   forming a gate electrode in contact with said first silicon dioxide region and said second silicon dioxide region; and
   forming a gate runner electrically connected to said gate electrode and arranged in a position facing said second silicon dioxide region,
   a thickness of said second silicon dioxide region being greater than a thickness of said first silicon dioxide region.

2. The method of manufacturing a silicon carbide semiconductor device according to claim 1, wherein
   said step of forming a first silicon dioxide region and said step of forming a second silicon dioxide region are performed by simultaneously oxidizing said first region and said silicon-containing-material.

3. The method of manufacturing a silicon carbide semiconductor device according to claim 1, wherein
   the thickness of said second silicon dioxide region is 1.5 times or more and 5 times or less the thickness of said first silicon dioxide region.

4. The method of manufacturing a silicon carbide semiconductor device according to claim 1, further comprising the step of forming a source wire arranged so as to be surrounded by said gate runner when viewed two-dimensionally.

5. The method of manufacturing a silicon carbide semiconductor device according to claim 1, wherein
   said gate runner is formed on an outer side relative to said second impurity region.

6. The method of manufacturing a silicon carbide semiconductor device according to claim 1, wherein
   said silicon carbide substrate further includes a JTE region in contact with said well region, and
   said gate runner is formed on an inner side relative to said JTE region.

7. The method of manufacturing a silicon carbide semiconductor device according to claim 1, wherein
   said second silicon dioxide region is formed so as to be in contact with an end portion of said first main surface.

8. The method of manufacturing a silicon carbide semiconductor device according to claim 1, further comprising the step of forming a source wire arranged so as to sandwich said gate runner there between when viewed two-dimensionally.

9. The method of manufacturing a silicon carbide semiconductor device according to claim 1, wherein
said step of forming a gate runner includes the step of forming a gate pad for applying a voltage to said gate runner, and
said gate runner is formed so as to extend from said gate pad in a branching manner.

10. The method of manufacturing a silicon carbide semiconductor device according to claim 1, further comprising the steps of:
forming a second silicon-containing-material in contact with said first impurity region; and
forming a third silicon dioxide region by oxidizing said second silicon-containing-material.

11. The method of manufacturing a silicon carbide semiconductor device according to claim 10, wherein
said step of forming a second silicon dioxide region and said step of forming a third silicon dioxide region are simultaneously performed.

\* \* \* \* \*